United States Patent
Hamanaka

(10) Patent No.: US 6,544,890 B2
(45) Date of Patent: *Apr. 8, 2003

(54) PROCESS FOR FABRICATING SEMICONDUCTOR DEVICE HAVING SILICIDE LAYER WITH LOW RESISTANCE AND UNIFORM PROFILE AND SPUTTERING SYSTEM USED THEREIN

(75) Inventor: Nobuaki Hamanaka, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/511,774

(22) Filed: Feb. 24, 2000

(65) Prior Publication Data

US 2002/0081827 A1 Jun. 27, 2002

(30) Foreign Application Priority Data

Feb. 26, 1999  (JP) .............................. 11-051872

(51) Int. Cl.⁷ ..................... H01L 21/44; H01L 21/3205
(52) U.S. Cl. ....................... 438/682; 438/592; 438/685
(58) Field of Search ............................... 438/682, 683, 438/908, 592, 685, 686; 257/309; 118/719

(56) References Cited

U.S. PATENT DOCUMENTS

| | | | | |
|---|---|---|---|---|
| 4,951,601 A | * | 8/1990 | Maydan et al. ............. | 118/719 |
| 5,043,299 A | * | 8/1991 | Chang et al. ............... | 437/192 |
| 5,121,705 A | * | 6/1992 | Sungino ..................... | 118/719 |
| 5,188,280 A | * | 2/1993 | Nakao et al. ............... | 228/123 |
| 5,384,285 A | * | 1/1995 | Sitaram et al. ............. | 437/200 |
| 5,425,611 A | * | 6/1995 | Hughes et al. ............. | 414/217 |
| 5,433,785 A | * | 7/1995 | Saito .......................... | 118/719 |
| 5,728,625 A | * | 3/1998 | Tung .......................... | 438/586 |
| 5,780,361 A | * | 7/1998 | Inoue ......................... | 438/683 |
| 5,951,770 A | * | 9/1999 | Perlov et al. ............... | 118/719 |
| 5,953,633 A | * | 9/1999 | Chen et al. ................. | 438/683 |
| 6,015,989 A | * | 1/2000 | Horikawa ................... | 257/309 |
| 6,110,232 A | * | 8/2000 | Chen et al. ................. | 29/25.01 |

FOREIGN PATENT DOCUMENTS

| | | |
|---|---|---|
| JP | 5-21382 | 1/1993 |
| JP | 5-36618 | 2/1993 |
| JP | 6-140294 | 5/1994 |
| JP | 7-122744 | 5/1995 |
| JP | 8-78359 | 3/1996 |
| JP | 8-134638 | 5/1996 |
| JP | 9-69497 | 3/1997 |
| JP | 10-261596 | 9/1998 |

* cited by examiner

*Primary Examiner*—Michael Trinh
(74) *Attorney, Agent, or Firm*—Sughrue Mion, PLLC

(57) ABSTRACT

Cobalt is sputtered on a silicon wafer in a deposition chamber of a magnetron sputtering system, and is conveyed to a load-lock chamber where a partial pressure of oxygen and/or the water concentration is controlled with introduction of nitrogen so as to present dicobalt disilicide layers from oxidation, thereby improving the production yield and reliability of the silicide layer morphology.

21 Claims, 10 Drawing Sheets

PROCESS FOR FABRICATING SEMICONDUCTOR DEVICE HAVING SILICIDE LAYER WITH LOW RESISTANCE AND UNIFORM PROFILE AND SPUTTERING SYSTEM USED THEREIN

FIELD OF THE INVENTION

This invention relates to a fabrication technology for a semiconductor device and, more particularly, to a process for fabricating a semiconductor device having silicide layers and a sputtering system used therein.

DESCRIPTION OF THE RELATED ART

FIG. 1 illustrates a typical example of the sputtering system. The prior art sputtering system has a load-lock chamber 401, a transfer chamber 402 and a deposition chamber 450, and a gate valve 404 is provided between the load-lock chamber 401 and the deposition chamber 450. A wafer holder/conveying arm 405 is movable between the load-lock chamber 401 and the deposition chamber 450 through the gate valve 404, and conveys a semiconductor wafer 406 between the load-lock chamber 401 and the deposition chamber 450. Another gate valve 404 is connected between the transfer chamber 402 and the deposition chamber 450.

Though not shown in FIG. 1, a target is opposed to the semiconductor wafer 406 in the deposition chamber 450, and is subjected to ion-bombardment so as to deposit material such as metal with a high-temperature melting-point on the semiconductor wafer 406. In the following description, the term "metal with a high-temperature melting-point".

An air valve 407 is connected between the load-lock chamber 401 and the outside, and an inert gas inlet port 408 is open to the load-lock chamber 401. Although a wafer inlet port is further connected to the load-lock chamber 401, it is not shown in FIG. 1.

The prior art sputtering system is available for a sliced process disclosed in Japanese Patent Publication of Unexamined Application (laid-open) No. 9-69497. FIGS. 2A to 2D shows the prior art process disclosed in the Japanese Patent Application of Unexamined Application. The prior art process starts with preparation of a p-type silicon substrate 301. An n-type well 302 is formed in a surface portion of the p-type silicon substrate 301. A field oxide 303 is selectively grown on the p-type silicon substrate 301 through a selective oxidization process, and defines active regions.

Silicon oxide is selectively grown on the active regions. The active regions are covered with silicon oxide layers. Polysilicon is deposited over the entire surface of the resultant structure, and the silicon oxide layers are over-lain by the polysilicon layer. Phosphorous is doped into the polysilicon layer so as to reduce the resistivity of the polysilicon layer. A photo-resist etching mask is formed on the phosphorous-doped polysilicon layer by using a photo-lithography, and the phosphorous-doped polysilicon layer and the silicon oxide layers are selectively etched by using a dry etching technique. Then, gate oxide layers 304 and gate electrodes 305 are left on the active regions.

A photo-resist ion-implantation mask is formed on the resultant structure by using the photo-lithography. The n-type well 302 is covered with the photo-resist ion-implantation mask, and the p-type silicon substrate 301 is exposed to a hole formed in the photo-resist ion-implantation mask. N-type dopant impurity is ion implanted into the p-type silicon substrate 301. Then, lightly-doped n-type impurity regions 306 are formed in a self-aligned manner with the gate electrode 305. The photo-resist ion-implantation mask is stripped off.

Another photo-resist ion-implantation mask is formed on the resultant structure by using the photo-lithography. The n-type well 302 is exposed to a hole formed in the photo-resist ion-implantation mask, and the p-type silicon substrate 301 is covered with the photo-resist ion-implantation mask. P-type dopant impurity is ion implanted into the n-type well 302. Then, lightly-doped p-type impurity regions 307 are formed in a sell-aligned manner with the gate electrode 305. The photo-resist ion-implantation mask is stripped off.

Silicon oxide or silicon nitride is deposited over the entire surface of the resultant structure by using a chemical vapor deposition, and a silicon oxide layer or a silicon nitride layer is formed on the resultant structure. The silicon oxide layer or the silicon nitride layer is etched until the gate electrodes 305 are exposed, and side wall spacers 308 are formed on side surfaces of the gate electrodes 305 as shown in FIG. 2A.

A photo-resist ion-implantation mask is formed on the resultant structure by using the photo-lithography. The n-type well 302 is covered with the photo-resist ion-implantation mask, and the p-type silicon substrate 301 is exposed to a hole formed in the photo-resist ion-implantation mask. N-type dopant impurity is ion implanted into the p-type silicon substrate 301. Then, heavily-doped n-type impurity regions 309 are formed in a self-aligned manner with the side wall spacers 308. The photo-resist ion-implantation mask is stripped off, and n-type source/drain regions 306/309 are formed in the p-type silicon substrate 301.

Another photo-resist ion-implantation mask is formed on the resultant structure. The n-type well 302 is exposed to a hole formed in the photo-resist ion-implantation mask, and the p-type silicon substrate 301 is covered with the photo-resist ion-implantation mask. P-type dopant impurity is ion implanted into the n-type well 302. Then, heavily-doped p-type impurity regions 310 are formed in a self-aligned manner with the side wall spacers 308. The photo-resist ion-implantation mask is stripped off, and p-type source/drain regions 307/310 are formed in the n-type well 302.

Subsequently, native oxide is removed from the upper surfaces of the gate electrodes 305, the p-type silicon substrate 301 and the n-type well 302. Cobalt is deposited over the entire surface of the resultant structure at a certain temperature between 200 degrees and 500 degrees in centigrade by using a magnetron sputtering system. The deposition temperature may be 450 degrees in centigrade. The cobalt forms a cobalt layer 311. The cobalt layer on the gate electrode 305, the n-type source/drain regions 306/309 and the p-type source/drain regions 307/310 reacts with the polysilicon/single crystalline silicon, and is partially converted to dicobalt monosilicide layer 312. However, the cobalt layer 311 is left on the side wall spacers 308 and the field oxide layer 303 as shown in FIG. 2B.

Subsequently, the resultant structure is placed in nitrogen atmosphere, and is treated with heat at 500 degrees in centigrade or higher than 500 degrees in centigrade by using a rapid thermal annealing technique. Then, the dicobalt monosilicide is converted to cobalt-monosilicide or cobalt-disilicide. As a result, the gate electrodes 305, the heavily-doped n-type impurity regions 309 and the heavily-doped p-type impurity regions 310 are covered with cobalt-monosilicide/cobalt-disilicide layers 313, respectively, as shown in FIG. 2C. The residual cobalt layer 311 is partially oxidized.

Subsequently, the resultant structure is dipped into water solution containing hydrochloride acid and hydrogen peroxide. The residual cobalt layer 311 and the cobalt oxide are etched away in the water solution.

Finally, the rapid thermal annealing is carried out at 800 degrees in centigrade, and the cobalt monosilicide is converted to cobalt disilicide. As a result, the gate electrodes 305, the heavily-doped n-type impurity regions 309 and the heavily-doped p-type impurity regions 310 are covered with cobalt disilicide layers 314 as shown in FIG. 2D. Thus, the gate electrodes 305, the n-type source/drain regions and the p-type source/drain regions have the cobalt disilicide layer.

The prior art sputtering system shown in FIG. 1 is used in the deposition step for the cobalt layer 311. The present inventor evaluated the cobalt silicide structure formed through the prior art process. The present inventor fabricated samples equivalent to the prior art semiconductor device as follows.

First, boron was ion implanted into polysilicon gate electrodes at dosage of $3 \times 10^{15}$ atom/cm$^2$, and cobalt was deposited by using the prior art sputtering system. The cobalt was converted to cobalt silicide through the rapid thermal annealing. The present inventor measured the resistivity of the cobalt silicide layer. The resistivity was 9 Ω/□.

Arsenic was ion implanted into a silicon substrate at dosage of $5 \times 10^{15}$ atom/cm$^2$, and formed heavily-doped n-type source/drain regions in the silicon substrate. Cobalt was deposited over the heavily-doped n-type source/drain regions by using the prior art sputtering system, and the cobalt was converted to cobalt silicide through the rapid thermal annealing.

The residual cobalt on the side wall spacers and the field oxide layer was removed by using the wet etching.

The present inventor observed the samples, and found that the heavily-doped n-type source/drain regions swelled as indicated by reference numeral 315 in FIG. 2D. The present inventor analyzed the pieces of material 315. The pieces of material were silicon and silicon oxide. While the cobalt was being deposited at the high-temperature ambience, the dicobalt monosilicide was oxidized, and was separated into cobalt oxide and silicon/silicon oxide. The cobalt oxide was removed together with the residual cobalt in the wet etching, and the silicon/silicon oxide was left on the heavily-doped n-type source/drain regions. The pieces of silicon/silicon oxide 315 behaved as if the heavily-doped n-type source/drain regions swelled.

The present inventor concluded that the first problem was the high resistivity of the cobalt silicide layers and that the second problem was the swelling n-type source/drain regions due to the pieces 315 of silicon/silicon oxide.

SUMMARY OF THE INVENTION

It is therefore an important object of the present invention to provide a process for fabricating a semiconductor device through which a low-resistive high-melting point metal silicide layer was obtained without any swelling doped silicon region.

It is also an important object of the present invention to provide a sputtering system, which is used in the process according to the present invention.

To accomplish the object, the present invention proposes to prevent a high-melting point metal silicide layer from oxidation between a sputtering and an annealing.

In accordance with one aspect of the present invention, there is provided a process for fabricating a semiconductor device, and the process comprises the steps of a) preparing a substrate having silicon layers, b) conveying the substrate to a deposition chamber of a sputtering system, c) depositing a metal with a high-temperature melting-point over the silicon layers through a sputtering in the deposition chamber at a deposition temperature for covering the silicon layers with a layer of the metal with the high-temperature melting-point, d) conveying the substrate from the deposition chamber to a non-oxidizing ambience created in an intermediate chamber for preventing the layer of the metal with the high-temperature melting-point from oxidation, e) conveying the substrate from the intermediate chamber to an annealing chamber without exposing the layer of the metal with the high-temperature melting-point to an oxidizing atmosphere and f) converting the layer of the metal with the high-temperature melting-point to silicide layers of the metal with the high-temperature melting-point at an annealing temperature higher than the certain temperature.

In accordance with another aspect of the present invention, there is provided a sputtering system comprising a load-lock chamber connected to a source of inert gas and a source of vacuum for creating a non-oxidizing ambience therein under a monitor of the concentration of an oxidizer and having a water loader for storing semiconductor wafers, a deposition chamber connectable to the load-lock chamber and having a wafer holder for retaining at least one semiconductor wafer and a target for sputtering a material on the at least one semiconductor wafer and a conveyer for conveying the at cast one semiconductor wafer between the load-lock chamber and the deposition chamber.

BRIEF DESCRIPTION OF THE DRAWINGS

The features and advantages of the process and the sputtering system will be more clearly understood from the following description taken in conjunction with the accompanying drawings in which.

DESCRIPTION OF THE PREFERRED EMBODIMENTS

Process & Sputtering System

Figure 1:
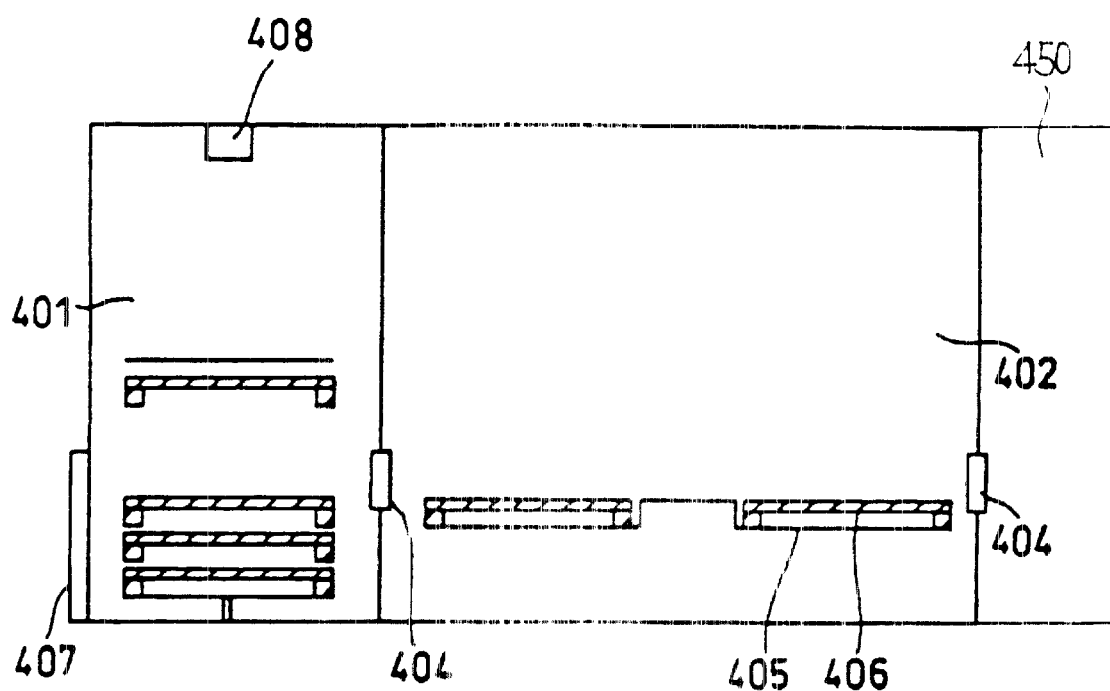
FIG. 1 is a schematic view showing the prior art sputtering system.
Figure 2A:
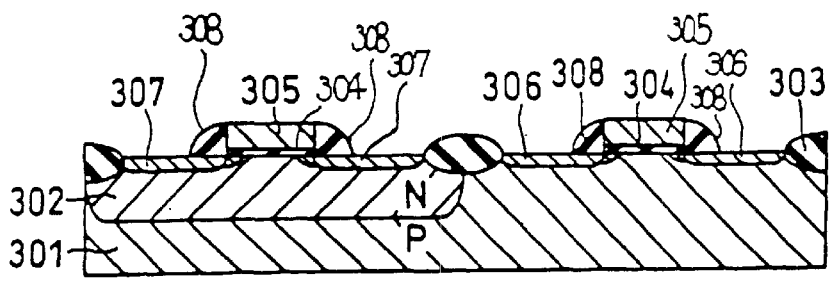
FIGS. 2A to 2D are cross sectional views showing the prior art process disclosed in Japanese Patent Publication of Unexamined Application No. 9-69497.
Figure 2B:
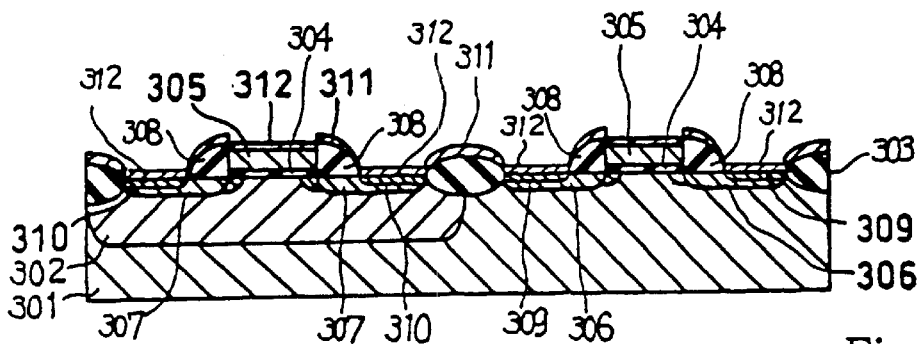
Figure 2C:
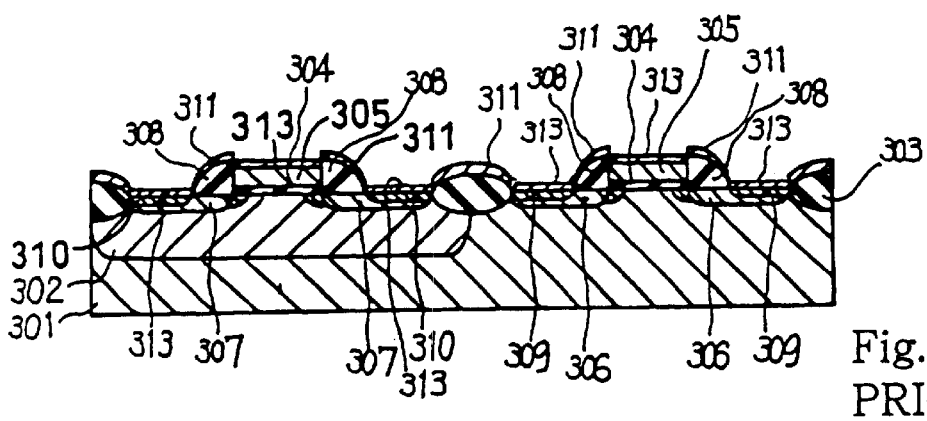
Figure 2D:
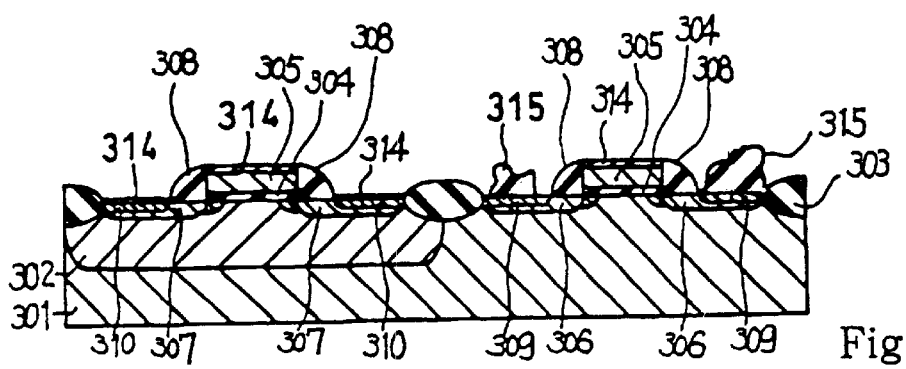
Figure 3A:
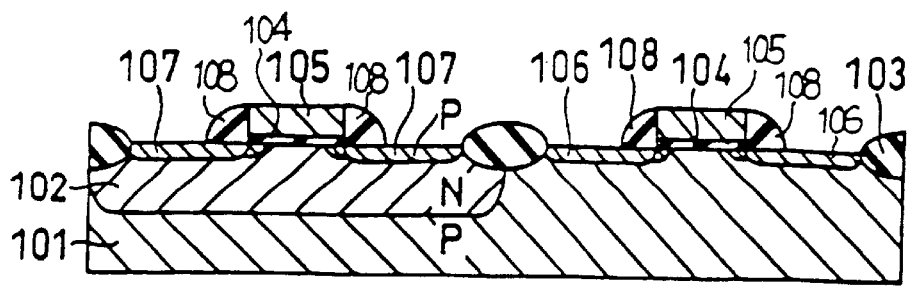
FIGS. 3A to 3D are cross sectional views showing a process for fabricating a semiconductor device according to the present invention.
Figure 3B:
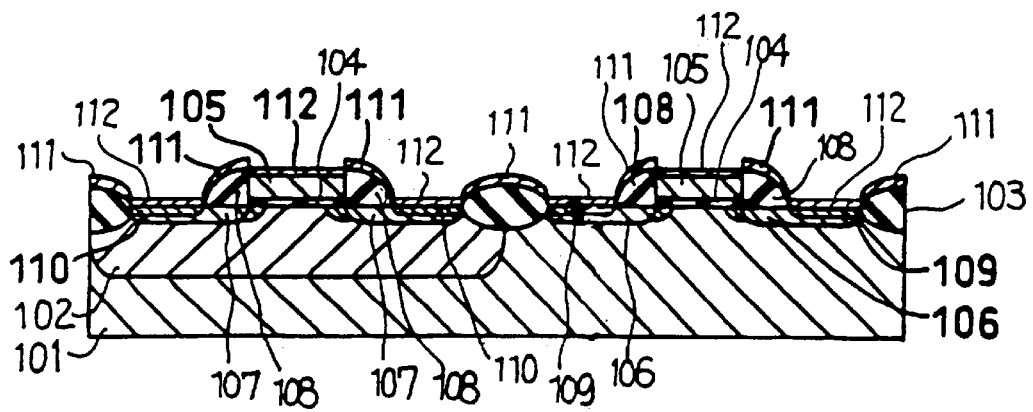
Figure 3C:
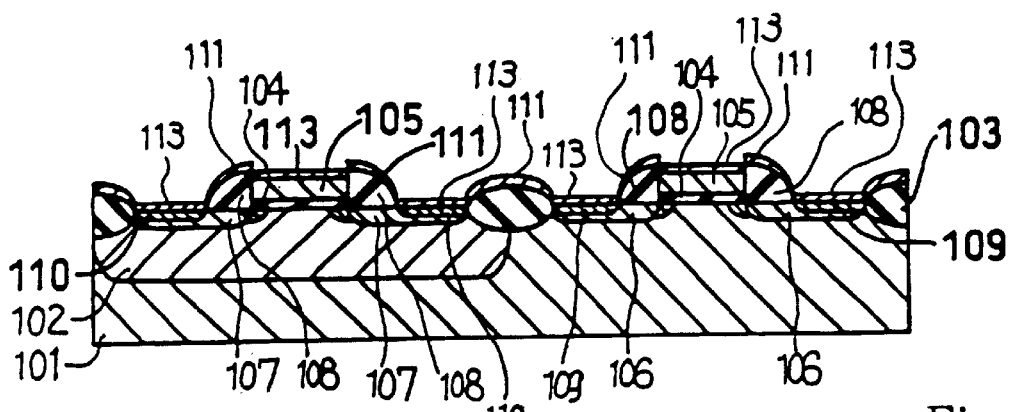
Figure 3D:
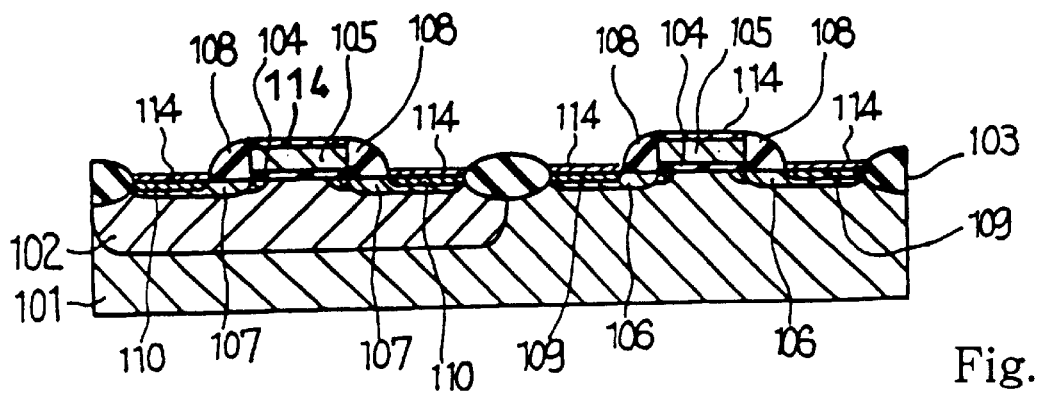
Figure 4:
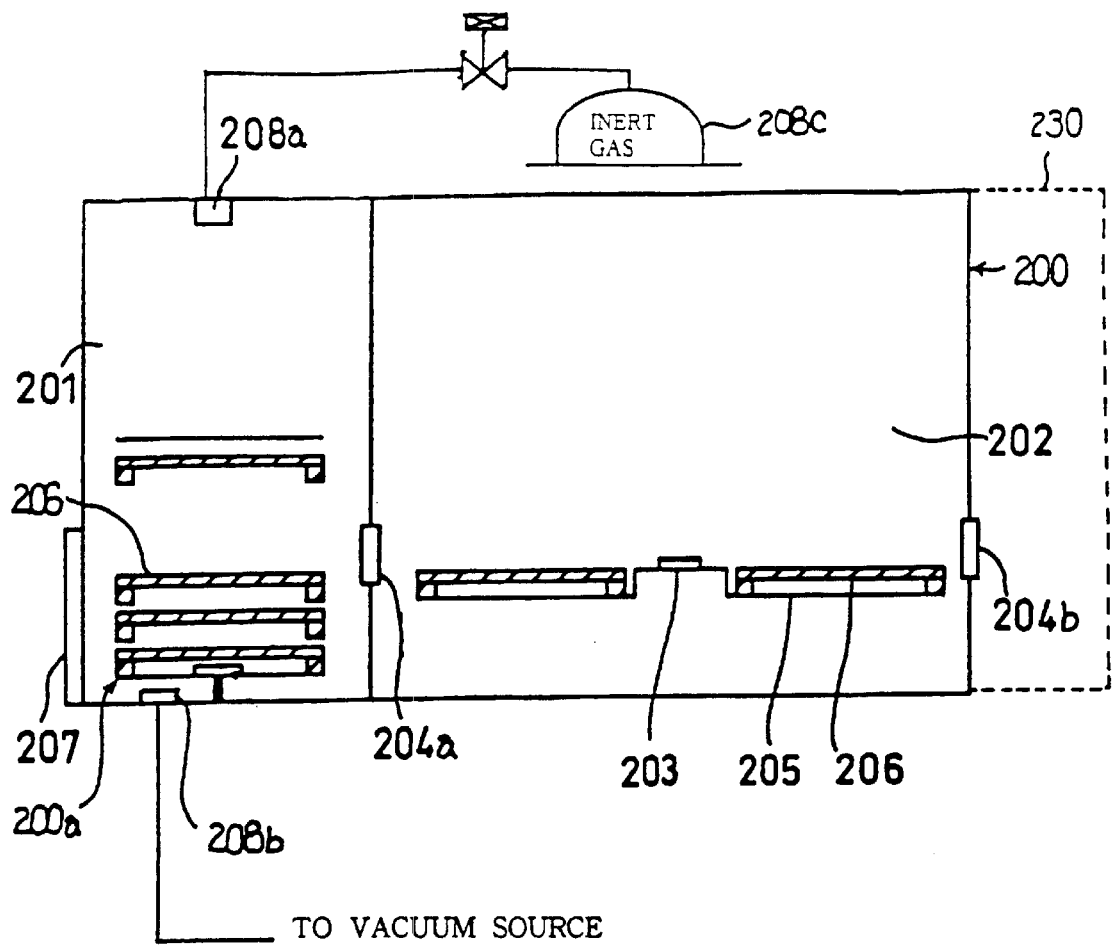
FIG. 4 is a schematic view showing a sputtering system used in the process according to the present invention.

FIGS. 3A to 3D illustrate a process for fabricating a semiconductor device embodying the present invention, and FIG. 4 illustrates a sputtering system used in the process according to the present invention.

Description is firstly made on the sputtering system shown in FIG. 4. The sputtering system shown in FIG. 4 is categorized in the magnetron sputtering system. The sputtering system comprises a reactor 200. The reactor 200 has walls, which define a load-lock chamber 201, a transfer chamber 202 and a deposition chamber 230. A wafer loader 200a is installed in the load-lock chamber 201, and semiconductor wafers 206 are stored in the wafer loader 200a. An air inlet port 207, a gas inlet port 208a and a gas outlet port 208b are provided to the reactor 200, and the outside, an inert gas source 208c and a vacuum source (not shown) are connected through the air inlet port 207, the gas inlet port 208a and the gas outlet port 208b to the load-lock chamber 201. The inert gas is at room temperature.

Gate valves 204a/204b are respectively provided to the walls, and connect the load-lock chamber 201 and the transfer chamber 202 to the transfer chamber 202 and the deposition chamber 230, respectively. A conveyor/wafer holder 205 is installed in the transfer chamber 202. The semiconductor wafer 206 is conveyed between the load-lock chamber 201 and the deposition chamber 230 through the gate valves 204a/204b. The semiconductor wafer 206 is conveyed between the load-lock chamber 201 and the deposition chamber 230 without being exposed to the atmosphere. A target is installed in the deposition chamber 230. The target (not shown) and the semiconductor wafer 206 may be formed of metal with a high-temperature melting point and single crystalline silicon, respectively.

In this instance, a rapid thermal annealing is carried out outside of the sputtering system. For this reason, the semiconductor wafer 206 is transferred from the deposition chamber 230 through the transfer chamber 202 to the load-lock chamber 201, and is taken out from the load-lock chamber 201. Thereafter, the semiconductor wafer 206 is conveyed to an annealing chamber (not shown). In the annealing chamber, the semiconductor wafer 206 is treated with heat.

A monitor 203 is provided in the vicinity of the semiconductor wafer 206 conveyed into the deposition chamber 230. The monitor 203 measures the partial pressure of oxygen and the water concentration in the ambience. When the gate valve 204a is open, the partial pressure of oxygen and the water concentration in the load-lock chamber 201 are greater than those in the transfer chamber 202, which in turn are greater than those in the deposition chamber 230 due to condensate on the inner wall.

Using the magnetron sputtering system, a semiconductor integrated circuit device is fabricated as follows. FIGS. 3A to 3D illustrate a process for fabricating the semiconductor integrated circuit device.

The process starts with preparation of a p-type single crystalline silicon substrate 101. An n-type well 102 is formed in a surface portion of the p-type single crystalline silicon substrate 101. Silicon oxide is selectively grown on the p-type single crystalline silicon substrate 101 by using a selective oxidation technique, and forms field oxide layer 103. The field oxide layer 103 defines active regions.

Silicon oxide is selectively grown on the active regions. The active regions are covered with silicon oxide layers. Polysilicon is deposited over the entire surface of the resultant structure, and the silicon oxide layers are over-lain by the polysilicon layer. Phosphorous is doped into the polysilicon layer so as to reduce the resistivity of the polysilicon layer. A photo-resist etching mask is formed on the phosphorous-doped polysilicon layer by using a photo-lithography, and the phosphorous-doped polysilicon layer and the silicon oxide layers are selectively etched by using a dry etching technique. Then, gate oxide layers 104 and gate electrodes 105 are left on the active regions. The p-type single crystalline silicon substrate 101 and the n-type well 102 are exposed on both sides of the gate oxide layers 104.

A photo-resist ion-implantation mask is formed on the resultant structure by using the photo-lithography. The n-type well 102 is covered with the photo-resist ion-implantation mask, and the p-type single crystalline silicon substrate 101 is exposed to a hole formed in the photo-resist ion-implantation mask. N-type dopant impurity is ion implanted into the p-type single crystalline silicon substrate 101. Then, lightly-doped n-type impurity regions 106 are formed in a self-aligned manner with the gate electrode 105. The photo-resist ion-implantation mask is stripped off.

Another photo-resist ion-implantation mask is formed on the resultant structure by using the photo-lithography. The n-type well 102 is exposed to a hole formed in the photo-resist ion-implantation mask, and the p-type single crystalline silicon substrate 101 is covered with the photo-resist ion-implantation mask. P-type dopant impurity is ion implanted into the n-type well 102. Then, lightly-doped p-type impurity regions 107 are formed in a self-aligned manner with the gate electrode 105. The photo-resist ion-implantation mask is stripped off.

Silicon oxide or silicon nitride is deposited over the entire surface of the resultant structure by using a chemical vapor deposition. Then, a silicon oxide layer or a silicon nitride layer is formed on the resultant structure. The silicon oxide layer or the silicon nitride layer is etched until the gate electrodes 105 are exposed, and side wall spacers 108 are formed on side surfaces of the gate electrodes 105 as shown in FIG. 3A.

A photo-resist ion-implantation mask is formed on the resultant structure by using the photo-lithography. The n-type well 102 is covered with the photo-resist ion-implantation mask, and the p-type single crystalline silicon substrate 101 is exposed to a hole formed in the photo-resist ion-implantation mask. N-type dopant impurity is ion implanted into the p-type single crystalline silicon substrate 101. Then, heavily-doped n-type impurity regions 109 are formed in a self-aligned manner with the side wall spacers 108. The photo-resist ion-implantation mask is stripped off, and n-type source/drain regions 106/109 are formed in the p-type silicon substrate 101. The n-type source/drain regions 106/109 have an LDD (Lightly-Doped Drain) structure.

Another photo-resist ion-implantation mask is formed on the resultant structure. The n-type well 102 is exposed to a hole formed in the photo-resist ion-implantation mask, and the p-type single crystalline silicon substrate 101 is covered with the photo-resist ion-implantation mask. P-type dopant impurity is ion implanted into the n-type well 102. Then, heavily-doped p-type impurity regions 110 are formed in a self-aligned manner with the side wall spacers 108. The photo-resist ion-implantation mask is stripped off, and p-type source/drain regions 107/110 are formed in the n-type well 102. The p-type source/drain regions 107/110 have the LDD structure.

Subsequently, native oxide is removed from the upper surfaces of the gate electrodes 105, the p-type single crystalline silicon substrate 101 and the n-type well 102. The resultant structure is taken into the load-lock chamber 201 of the magnetron sputtering system shown in FIG. 4.

The air inlet port 207 is kept open, and the load-lock chamber 201 is at the atmospheric pressure. The air inlet port 207 is closed, and the gas outlet port 208b is opened. The load-lock chamber 201 is connected through the gas outlet port 208b to the vacuum source such as, for example, a cryostat pump, and the air is-evacuated from the load-lock chamber 201. Vacuum is developed in the load-lock chamber 201, and reaches $1 \times 10^{-5}$ torr. The gas outlet port 208b is closed.

Subsequently, the gas inlet port 208a is opened, and inert gas such as nitrogen is introduced into the load-lock chamber 201. The load-lock chamber 201 is recovered to the atmospheric pressure. Thus, residual gas is purged with the inert gas. The gas outlet port 208 is opened again, and the inert gas is evacuated from the load-lock chamber 201 until $1 \times 10^{-6}$ torr. After the evacuation, the partial pressure of oxygen is extremely low, and the water concentration is also extremely small. The partial pressure and the water concentration are measured by the monitor 203 installed in the transfer chamber 202.

When the monitor 203 indicates that the partial pressure of oxygen and/or the water concentration reaches the extremely small value, the resultant structure is conveyed from the load-lock chamber 201 through the gate valve 204a, the transfer chamber 202 and the gate valve 204b to the deposition chamber 230, and is opposed to a cobalt target (not shown) in the deposition chamber 230.

The cobalt target is subjected to ion-bombardment, and cobalt is deposited over the entire surface of the resultant structure at 450 degrees in centigrade. The deposition temperature may range between 200 degrees to 500 degrees in centigrade. The gas inlet port 208a is opened before the initiation of sputtering, and the inert gas at room temperature is introduced into the load-lock chamber 201. The inert gas keeps the partial pressure of oxygen and the water concentration extremely low. The inert gas may be supplemented during the sputtering.

The cobalt forms a cobalt layers 111 on the field oxide layer 103 and the side wall spacers 108. However, the cobalt on the gate electrodes 105, the n-type source/drain regions 106/109 and the p-type source/drain regions 107/110 reacts with the polysilicon/single crystalline silicon, and is converted to dicobalt monosilicide ($Co_2Si$). Thus, the gate electrodes 105, the n-type source/drain regions 106/109 and the p-type source/drain regions 107/110 are covered with the dicobalt monosilicide layers 112 as shown in FIG. 3B.

Upon completion of the sputtering, the resultant structure shown in FIG. 3B is conveyed from the deposition chamber 230 through the gate valves 204a/204b and the transfer chamber 202 to the load-lock chamber 201. The partial pressure of oxygen and the water concentration in the load-lock chamber 201 are extremely low, and the load-lock chamber 201 is filled with the inert gas. The resultant structure is rapidly cooled in the load-lock chamber 201, and the cobalt layers 111 and the dicobalt monosilicide layers 112 are hardly oxidized.

Subsequently, the resultant structure is conveyed from the load-lock chamber 201 to the annealing chamber (not shown) for the first rapid thermal annealing. The annealing chamber has been already filled with the inert gas, i.e., nitrogen. The resultant structure is heated to at least 500 degrees in centigrade in the inert gas ambience by using a rapid thermal annealing technique. Then, the dicobalt monosilicide is converted to cobalt-monosilicide (CoSi) or cobalt-disilicide ($CoSi_2$). As a result, the gate electrodes 105, the heavily-doped n-type impurity regions 109 and the heavily-doped p-type impurity regions 110 are covered with cobalt-monosilicide/cobalt-disilicide layers 113, respectively, as shown in FIG. 3C. The cobalt layers 111 are partially oxidized.

The resultant structure shown in FIG. 3C is taken out from the annealing chamber. The resultant structure is dipped into water solution containing hydrochloride acid and hydrogen peroxide. The residual cobalt layer 111 and the cobalt oxide are etched away in the water solution.

Finally, the second rapid thermal annealing is carried out in the annealing chamber at a certain annealing temperature higher than the previous annealing temperature. The certain annealing temperature may be 800 degrees in centigrade. The cobalt monosilicide is converted to the cobalt disilicide. As a result, the gate electrodes 105, the heavily-doped n-type impurity regions 109 and the heavily-doped p-type impurity regions 110 are covered with cobalt disilicide layers 114 as shown in FIG. 3D. Thus, the gate electrodes 105, the n-type source/drain regions 106/109 and the p-type source/drain regions 107/110 have the silicide layers. The cobalt disilicide layers 114 are low in resistivity, and have smooth surfaces. The reason why the cobalt disilicide layers 114 have low resistivity and smooth surfaces will be described hereinlater in detail.

As described hereinbefore, the resultant structure is conveyed from the deposition chamber 230 through the transfer chamber 202 to the load-lock chamber 201 without being exposed to the atmosphere. The load-lock chamber 201 has been purged with the inert gas at room temperature, and the dicobalt monosilicide layers 112 are cooled down without oxidation before the annealing in the nitrogen atmosphere. Thus, the control of oxygen partial pressure, water concentration and temperature in the load-lock chamber 201 is effective against the oxidation of the dicobalt monosilicide. After the first annealing in the nitrogen atmosphere, the cobalt oxide is removed in the wet etchant. However, the cobalt monosilicide is resistive against the wet etchant. This means that the cobalt monosilicide layers 113 are not reduced in thickness, and the cobalt monosilicide layers 113 are converted to the cobalt disilicide layers 114 in the next heat treatment. Thus, the process according to the present invention keeps the cobalt disilicide layers 114 thick, and the resistance is not increased.

If the partial pressure of oxygen, the water concentration and the temperature are not controlled in the load-lock chamber, the dicobalt monosilicide layers 112 are partially oxidized in the load-lock chamber. The cobalt oxide is never reduced in the first annealing, and the cobalt oxide is etched away from the cobalt monosilicide/cobalt disilicide layers into the wet etchant. As a result, the cobalt disilicide layers 114 are reduced in thickness, and increase the resistance.

The present inventor fabricated the silicide structure under the control of the oxygen partial pressure, the water concentration and the temperature in the load-lock chamber 201 in accordance with the present invention. The present inventor further fabricated the silicide structure without controlling the oxygen partial pressure, the water concentration and the temperature. The present inventor measured the resistance of the silicide structure according to the present invention and the resistance of the silicide structure without controlling the oxygen partial pressure, the water concentration and the temperature in the load-lock chamber. The resistance of the silicide structure according to the present invention was lower than that of the silicide structure fabricated without controlling the partial pressure of oxygen, the water concentration and the temperature at 10 percent.

The present inventor investigated the cobalt disilicide layers 114 on the heavily-doped n-type impurity regions 109. Arsenic was ion implanted into the p-type single crystalline silicon substrate 101 at dosage of $5\times10^{15}$ atoms/$cm^2$, and the ion-implanted arsenic formed the heavily-doped n-type impurity regions 109. The cobalt disilicide layers 114 were produced on the heavily-doped n-type impurity regions 109 in accordance with the present invention. Present inventor observed the cobalt disilicide layers 114. The cobalt disilicide layers 114 had smooth surfaces, and did not peel from the heavily-doped n-type impurity regions 109.

The present inventor fabricated the cobalt disilicide layers on the heavily-doped n-type impurity regions 109 without controlling the oxygen partial pressure, the water concentration and the temperature in the load-lock chamber. The present inventor observed the cobalt disilicide layers, and found pieces of silicon/silicon oxide on the heavily-doped n-type impurity regions 109. The present inventor saw the pieces of silicon/silicon oxide as if the heavily-doped n-type impurity regions 109 swelled.

The process according to the present invention is applicable to other kinds of metal with a high-temperature melting-point. In the process, the cobalt target is replaced with a nickel target, an iron target or a titanium target, and the nickel, the iron or the titanium is deposited on silicon layers. The nickel layers, the iron layers or the titanium layers are converted to high-temperature melting point metal silicide layers. Thus, the magnetron sputtering system according to the present invention is used in the process for producing other kinds of hig-temperature melting-point metal silicide layers, and the oxygen partial pressure, the water concentration and the temperature are controlled in the load-lock chamber 201. The high-temperature melting-point metal silicide layers are prevented from increase of resistance and rough surfaces.

The magnetron sputtering system according to the present invention is available for deposition of ruthenium over the capacitor electrodes and deposition of metal with a high-temperature melting-point over a metal gate or a poly-metal gate. After the deposition of ruthenium, the resultant structure is conveyed to the load lock chamber where the oxygen partial pressure, the water concentration and the temperature are controlled.

COMPARATIVE EXPERIMENTS

Description is hereinbelow made on comparative experiments carried out by the present inventor.

FIRST EXAMPLE

The monitor 203 was installed in Model I-1060 manufactured by ANEL-VA Corporation. The target was formed of cobalt, and was 200 millimeters in diameter. P-type source/drain regions, n-type source/drain regions and poly-silicon gate electrodes were formed in and over single crystalline silicon wafers. The silicon wafers were placed in the load-lock chamber 201.

The air was evacuated from the load-lock chamber 201, and vacuum was developed in the load-lock chamber 201 at $1\times10^{-5}$ torr. The nitrogen gas was introduced into the load-lock chamber 201, and the resultant gas was purged. The nitrogen gas was evacuated from the load-lock chamber 201, and vacuum was developed in the load-lock chamber 201 at $1\times10^{-6}$ torr. The transfer chamber 202 was at $4\times10^{-8}$ torr, and the deposition chamber 230 was at $5\times10^{-7}$ torr. The silicon wafers were conveyed from the load-lock chamber 201 through the transfer chamber 202 to the deposition chamber 230.

The cobalt was sputtered over the silicon wafers under the following conditions. The wafer holder 205 was heated to 200 degrees to 450 degrees in centigrade, and the deposition chamber was maintained at 3 to 8 mill-torr. The heating was continued for 1 to 5 minutes, and the cobalt was deposited to 100 angstroms thick.

The nitrogen gas was introduced into the load-lock chamber at intervals each equal to the time period for maintaining each silicon wafer in the deposition chamber 201. In other words, while the cobalt was being sputtered on each of the silicon wafers, the nitrogen purge was repeated. The vacuum in the load-lock chamber 201 was $1\times10^{-5}$ torr immediately before introducing the nitrogen. For this reason, the load-lock chamber 201 was repeatedly purged with nitrogen, and the all the silicon wafers were conveyed from the deposition chamber to the load-lock chamber 201 after the nitrogen purge.

For the comparison, the present inventor sputtered the cobalt over single crystalline silicon wafers under the conditions same as the silicon wafers described hereinbefore except the nitrogen purge. The nitrogen purge was not carried out before the initiation of the sputtering, nor during the sputtering. These silicon wafers were hereinbelow referred to as "comparative silicon wafer".

Figure 5:
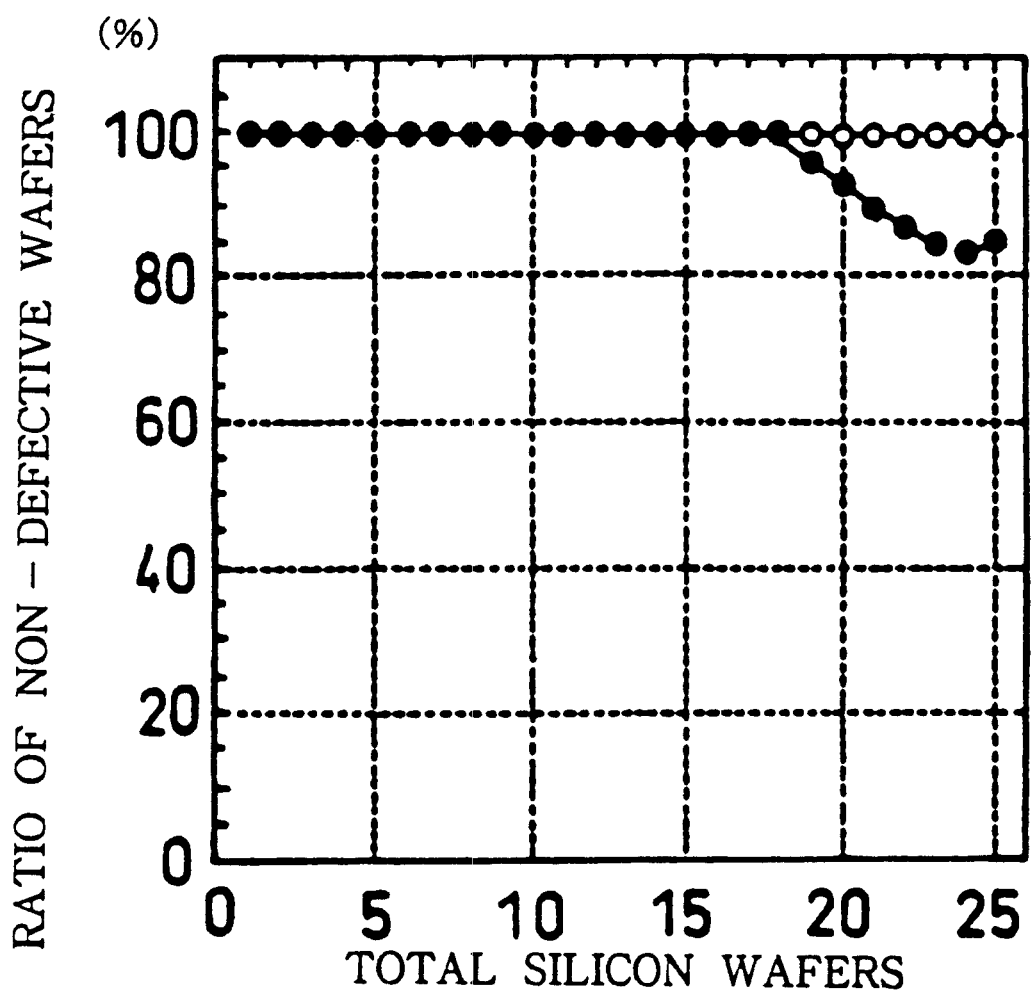
FIG. 5 is a graph showing the ratio of non-defective wafers to the total wafers.

The present inventor observed the cobalt disilicide layers on the silicon wafers sputtered according to the present invention and the cobalt disilicide layers on the comparative silicon wafers. The present inventor separated a silicon wafer with a defective cobalt disilicide layer on the n-type source/drain region from silicon wafers without any defective cobalt disilicide layer. The silicon wafer with a defective cobalt disilicide layer was hereinbelow referred to as "defective wafer", and the silicon wafer without any defective cobalt disilicide layer was referred to as "non-defective wafer". The present inventor calculated the ratio of non-defective wafers to all the silicon wafers according to the present invention, and plotted the ratio as indicated by small circles in FIG. 5. The present inventor also calculated the ratio of non-defective wafers to all the comparative silicon wafers, and plotted the ratio as indicated by dots in FIG. 5. As will be understood from FIG. 5, the silicon wafers according to the present invention were free from the defective cobalt disilicide layer. However, the nineteenth comparative wafer to the twenty-fourth comparative wafer were defective. When the comparative silicon wafers were conveyed to the load-lock chamber 201 after the sputtering, the comparative silicon wafers heated the load-lock chamber 201, and vaporized residual wafer in the load-lock chamber 201. The water vapor was accumulated in the load-lock chamber 201, and the dicobalt monosilicide layers were oxidized in the presence of the water vapor at high concentration. On the other hand, the water vapor containing nitrogen was replaced with fresh nitrogen for the silicon wafers according to the present invention. As a result, the water concentration was extremely low at all times, and, accordingly, the dicobalt monosilicide layers were never oxidized. Thus, the nitrogen ambience periodically refreshed in the load-lock chamber was effective against the oxidation of the dicobalt disilicide.

Subsequently, the present inventor measured the sheet resistance of the cobalt disilicide layers on the gate electrodes formed over the silicon wafers according to the present invention and the sheet resistance of the cobalt disilicide layers on the source/drain regions formed in the silicon wafers according to the present invention. The present inventor plotted the sheet resistance of the cobalt disilicide layers on the gate electrodes as indicated by small circles in FIG. 6 and the sheet resistance of the cobalt disilicide layers on the source/drain regions as indicated by small circles in FIG. 7. Similarly, the present inventor measured the sheet resistance of the cobalt disilicide layers on the gate electrodes formed over the comparative silicon wafers and the sheet resistance of the cobalt disilicide layers on the source/drain regions formed in the comparative silicon wafers. The present inventor plotted the sheet resistance of the cobalt disilicide layers on the gate electrodes as indicated by dots in FIG. 6 and the sheet resistance of the cobalt disilicide layers on the source/drain regions as indicated by dots in FIG. 7.

The sheet resistance was smaller in the cobalt disilicide layers formed in accordance with the present invention than in the cobalt disilicide layers formed on the comparative wafers regardless of the gate width and the width of source/drain regions. The large sheet resistance on the comparative wafers was derived from the oxidation due to the water vapor accumulated in the load-lock chamber 201.

SECOND EXAMPLE

Using the same sputtering system, cobalt was sputtered on silicon wafers in accordance with the present invention and on comparative silicon wafers under the following conditions. The air was evacuated from the load-lock chamber 201, and vacuum was developed at $1 \times 10^{-5}$ torr. The nitrogen was introduced into the load-lock chamber 201, and was evacuated from the load-lock chamber 201. The vacuum was developed at $1 \times 10^{-5}$ torr. The transfer chamber 202 was at $4 \times 10^{-8}$ torr, and the deposition chamber 230 was at $5 \times 10^{-7}$ torr. The wafer holder was heated to 200 degrees to 450 degrees in centigrade, and the chamber was maintained at 3 to 8 mill-torr. The heating time was 1 to 5 minutes. The cobalt was sputtered to 100 angstroms thick. The silicon wafers were successively conveyed to the deposition chamber 202 for the sputtering. The nitrogen was once introduced before the initiation of the sputtering. However, the nitrogen was not introduced into the load-lock chamber during the successive sputtering process.

The present inventor carried out the sputtering on the comparative silicon wafers under the same conditions. However, any nitrogen was not introduced into the load-lock chamber before the initiation of the sputtering.

Figure 8:
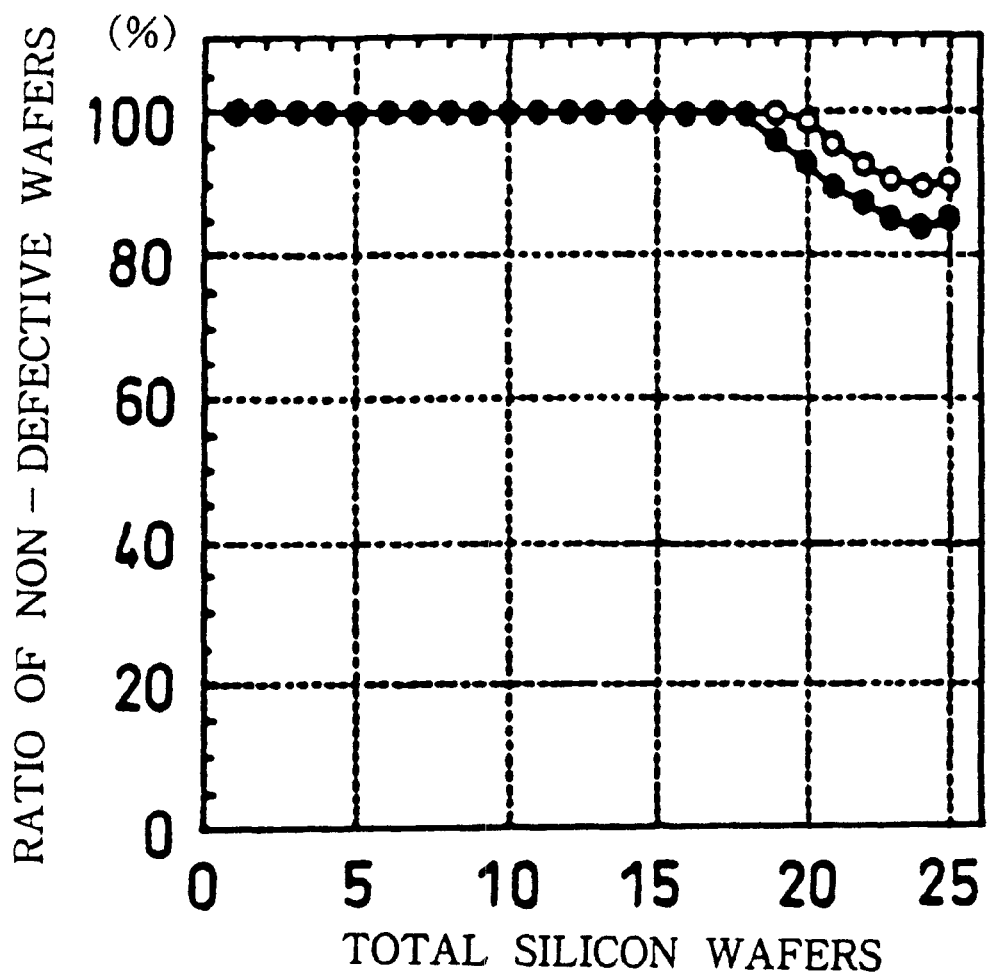
FIG. 8 is a graph showing the ratio of non-defective wafers to the total wafers under conditions of different nitrogen purge.

The present inventor observed the cobalt disilicide layers on the n-type source/drain regions on the silicon wafers conveyed to the load-lock chamber 201 once purged with the nitrogen, and plotted the ratio of non-defective wafers to all the silicon wafers as indicated by small circles in FIG. 8. Similarly, the present inventor observed the cobalt disilicide layers on the n-type source/drain regions on the comparative silicon wafers conveyed to the load-lock chamber without any nitrogen purge, and plotted the ratio of non-defective wafers as indicated by dots in FIG. 8. The ratio of non-defective wafers was gradually lowered regardless of the nitrogen purge before the sputtering. The plots taught that the dicobalt disilicide layers were not prevented from the oxidation.

Figure 6:
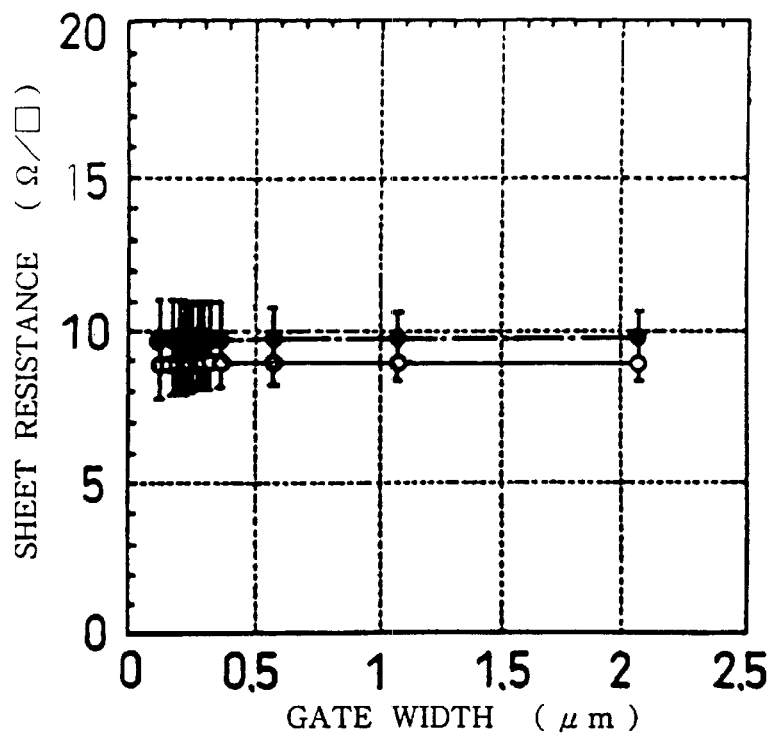
FIG. 6 is a graph showing the sheet resistance of cobalt disilicide layers in terms of the width of gate electrodes.
Figure 7:
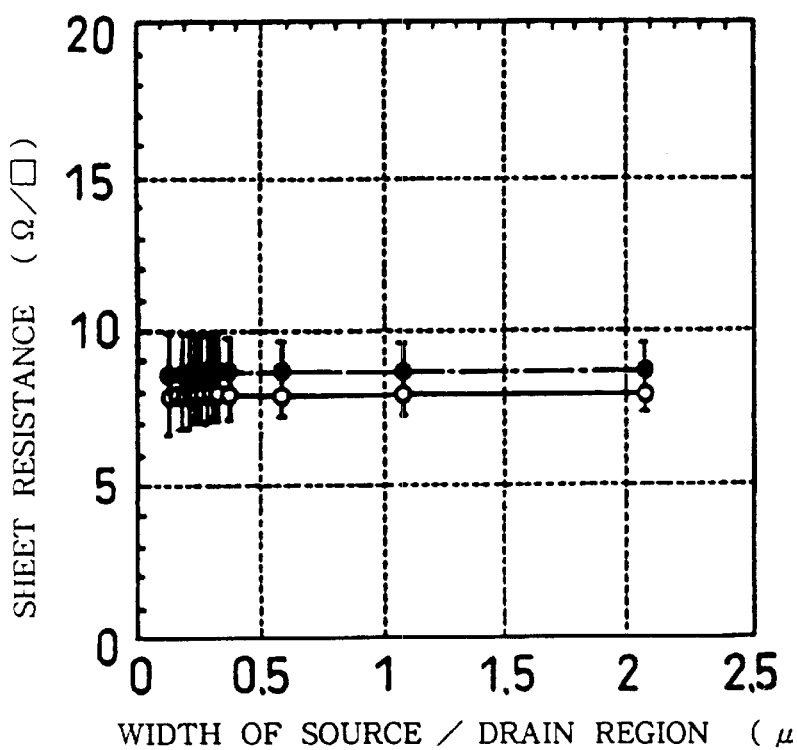
FIG. 7 is a graph showing the sheet resistance of cobalt disilicide layers in terms of the width of source/drain regions.
Figure 9:
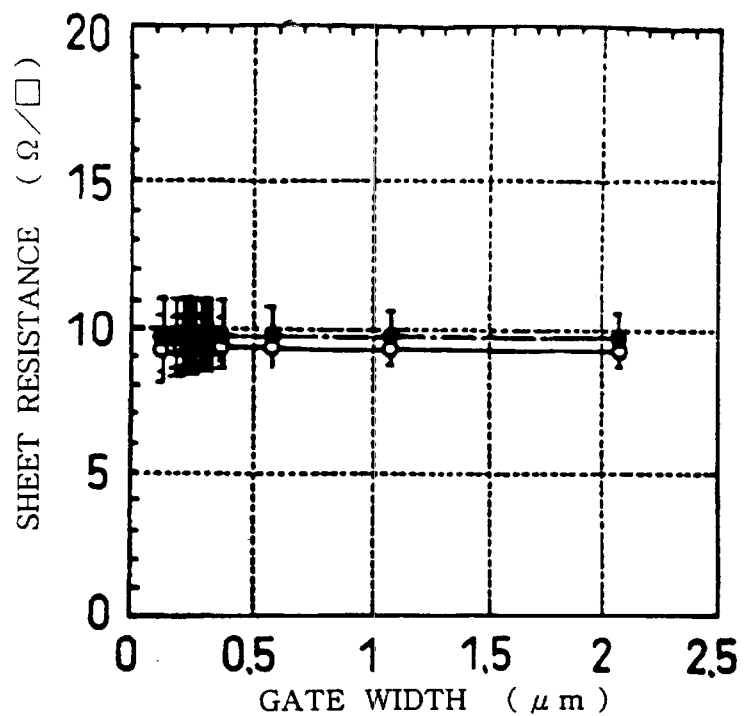
FIG. 9 is a graph showing the sheet resistance of cobalt disilicide layers in terms of the width of gate electrodes.
Figure 10:
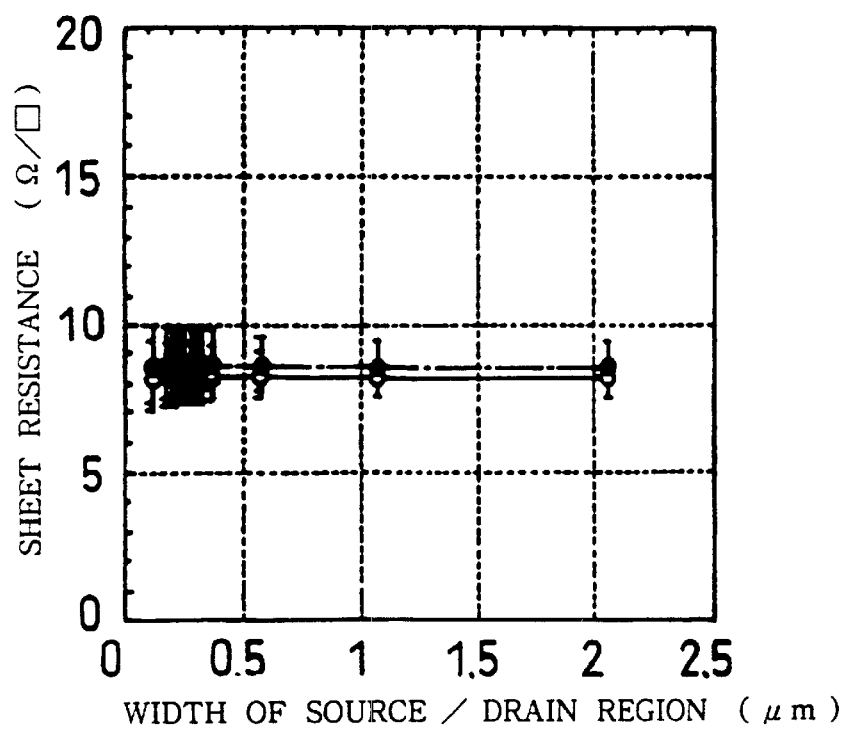
FIG. 10 is a graph showing the sheet resistance of cobalt disilicide layers in terms of the width of source/drain regions.

The present inventor measured the sheet resistance of the cobalt disilicide layers, and plotted the sheet resistance in FIGS. 9 and 10 as similar to the sheet resistance plotted in FIGS. 6 and 7. Although the sheet resistance of the cobalt disilicide layers conveyed to the load-lock chamber once purged with the nitrogen was smaller than the sheet resistance of the cobalt disilicide layers conveyed to the load-lock chamber without any nitrogen purge, the difference was smaller than that between the dots and the small circles in FIGS. 6 and 7.

Comparing the small circles with the dots, it was understood that the nitrogen purge before the sputtering was not so effective against the oxidation, because the water vapor was also accumulated in the load-lock chamber once purged with nitrogen. In other words, it was necessary to restrict the wafer vapor concentration under a certain value at all times.

THIRD EXAMPLE

Using the same sputtering system, cobalt was sputtered on silicon wafers in accordance with the present invention and on comparative silicon wafers under the following conditions. The air was evacuated from the load-lock chamber 201, and vacuum was developed at $1 \times 10^{-5}$ torr. Any nitrogen purge was not carried out before the sputtering. The transfer chamber 202 was at $4 \times 10^{-8}$ torr, and the deposition chamber 230 was at $5 \times 10^{-7}$ torr. The wafer holder was heated to 200 degrees to 450 degrees in centigrade, and the chamber was maintained at 3 to 8 mill-torr. The heating time was 1 to 5 minutes. The cobalt was sputtered to 100 angstroms thick. The silicon wafers were successively conveyed to the deposition chamber 202 for the sputtering, and the nitrogen was introduced into the load-lock chamber 201 for a time period equal to the time period when the silicon wafer was maintained in the deposition chamber 202. The vacuum in the load-lock chamber 201 was $1 \times 10^{-5}$ torr immediately before the introduction of nitrogen.

The present inventor carried out the sputtering on the comparative silicon wafers under the same conditions. However, any nitrogen was not introduced into the load-lock chamber during the sputtering.

Figure 11:
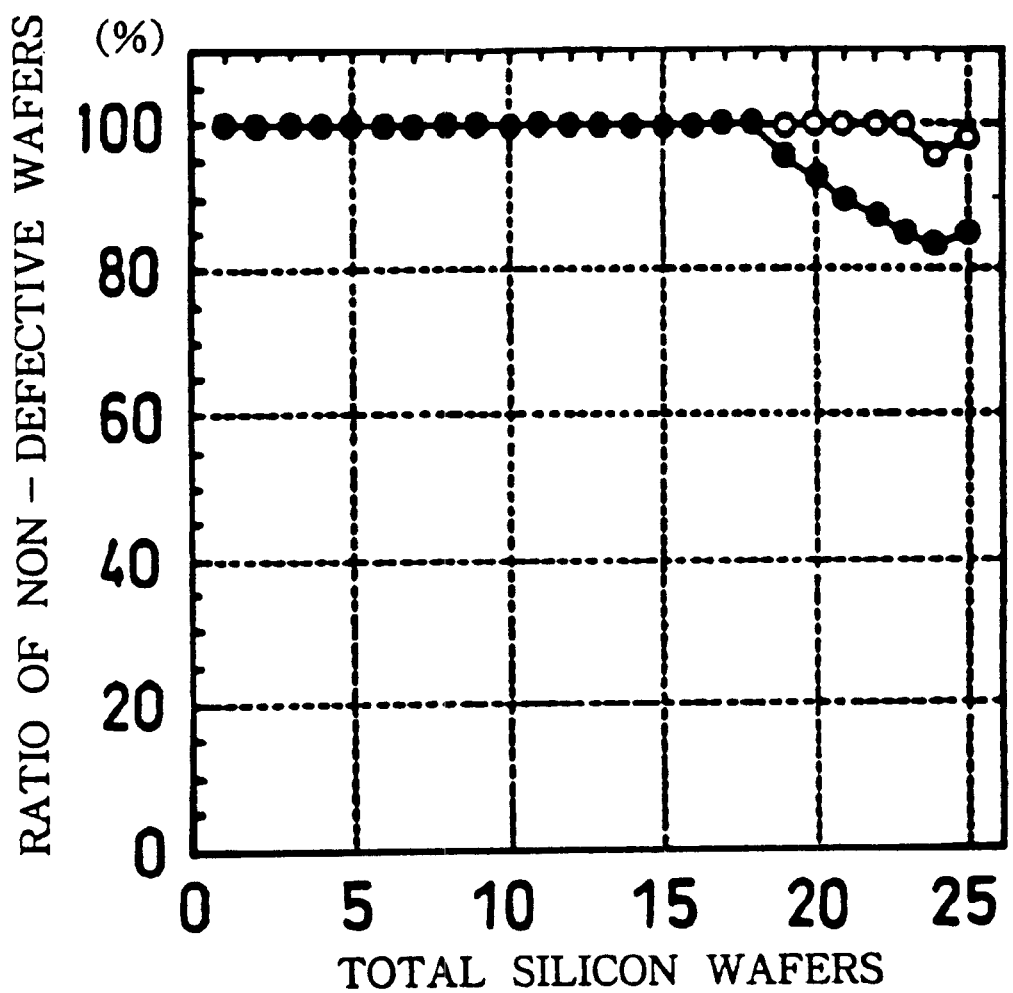
FIG. 11 is a graph showing the ratio of non-defective wafers to the total wafers under different conditions of nitrogen purge.

The present inventor observed the cobalt disilicide layers on the n-type source/drain regions on the silicon wafers conveyed to the load-lock chamber 201 repeatedly purged with the nitrogen during the sputtering, and plotted the ratio of non-defective wafers to all the silicon wafers as indicated by small circles in FIG. 11. Similarly, the present inventor observed the cobalt disilicide layers on the n-type source/drain regions on the comparative silicon wafers conveyed to the load-lock chamber without any nitrogen purge, and plotted the ratio of non-defective wafers as indicated by dots in FIG. 11. Although the ratio of non-defective comparative wafers was decreased from the nineteenth comparative wafer, the nitrogen purge during the sputtering kept the silicon wafer conveyed to the load-lock chamber repeatedly purged with nitrogen almost non-defective. Thus, the repetition of nitrogen purge was effective against the oxidation.

Figure 12:
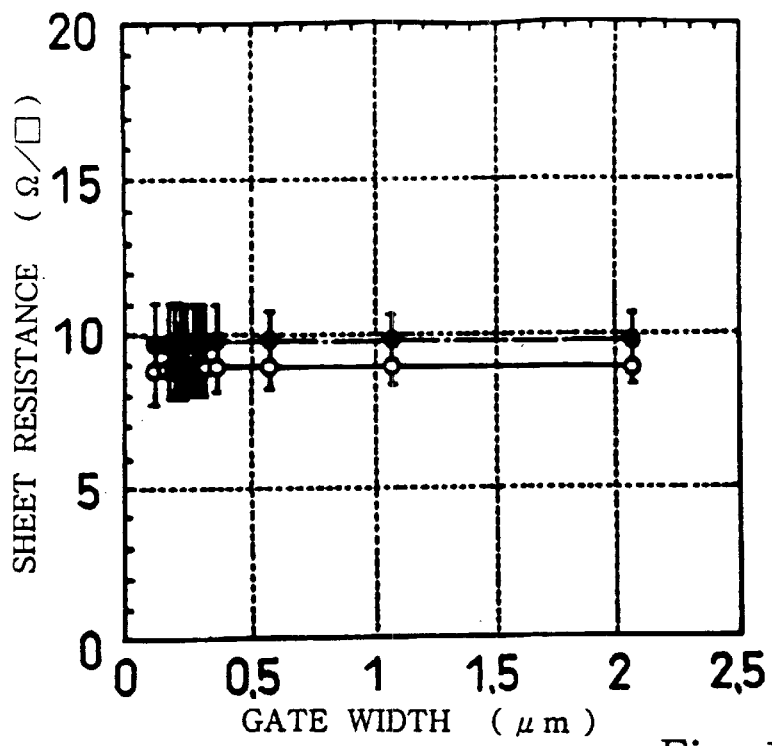
FIG. 12 is a graph showing the sheet resistance of cobalt disilicide layers in terms of the width of gate electrodes.
Figure 13:
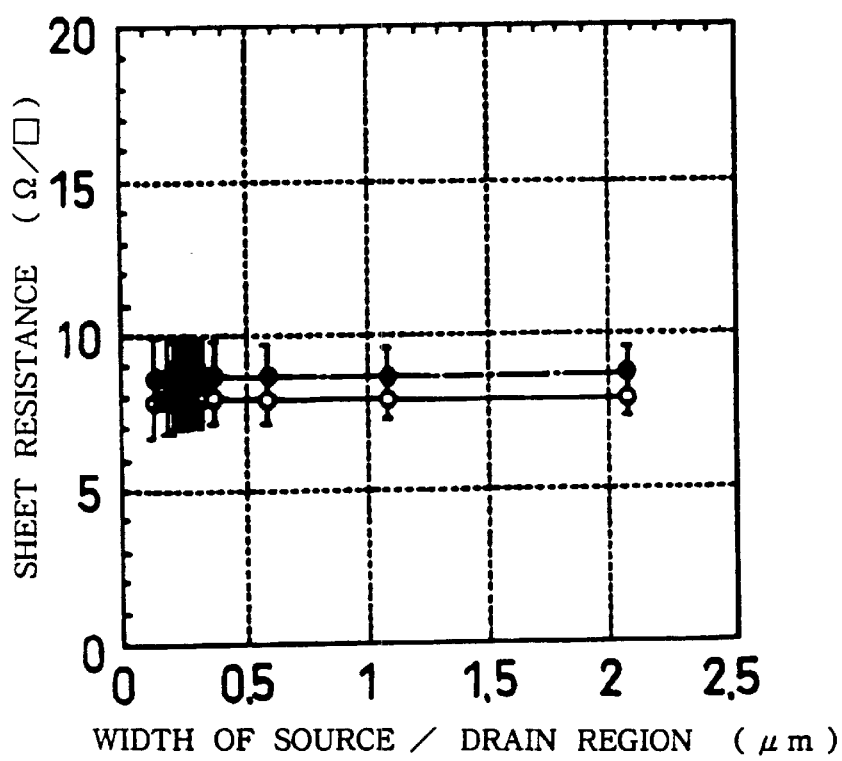
FIG. 13 is a graph showing the sheet resistance of cobalt disilicide layers in terms of the width of source/drain regions.

The present inventor measured the sheet resistance of the cobalt disilicide layers, and plotted the sheet resistance in FIGS. 12 and 13 as similar to the sheet resistance plotted in FIGS. 6 and 7. The sheet resistance of the cobalt disilicide layers conveyed to the load-lock chamber purged with the nitrogen was smaller than the sheet resistance of the cobalt disilicide layers conveyed to the load-lock chamber without any nitrogen purge, and the difference was as large as that between the dots and the small circles in FIGS. 6 and 7.

Comparing the small circles with the dots, it was understood that the repetition of nitrogen purge was effective against the oxidation.

In order to prevent the dicobalt monosilicide from the oxidation, the maximum partial pressure of oxygen, the maximum water concentration and the highest temperature in the load-lock chamber 201 are obtained at $1\times10^{-7}$ torr.

Although a particular embodiment of the present invention has been shown and described, it will be apparent to those skilled in the art that various changes and modifications may be made without departing from the spirit and scope of the present invention.

The monitor 203 may be installed in the load-lock chamber 201 or in both of the load-lock chamber 201 and the transfer chamber 202.

The metal with a high-temperature melting-point may be deposited on a silicon layer formed on an insulating substrate by using the sputtering system according to the present invention.

The load-lock chamber 201 and the deposition chamber 202 may form parts of another kind of sputtering system.

The annealing may be carried out outside the sputtering system. In case where the rapid thermal annealing is carried out outside the sputtering system, the annealing chamber is connected to the load-lock chamber 201 without exposing a semiconductor wafer to the oxidizable atmosphere.

What is claimed is:

1. A process for fabricating a semiconductor device comprising the steps of:
   a-1) placing a substrate having silicon layers in a load-lock chamber;
   a-2) developing a first vacuum in the load-lock chamber having a pressure of $1\times10^{-5}$ torr;
   a-3) introducing an inert gas into said load-lock chamber;
   a-4) developing a second vacuum in the load-lock chamber having a pressure of $1\times10^{-6}$ torr by evacuating said inert gas from said load-lock chamber; and
   b) conveying said substrate to a deposition chamber of a sputtering system.

2. The process for fabricating a semiconductor device of claim 1, further comprising the steps of:
   c) depositing a metal with a high-temperature melting-point over said silicon layers through a sputtering in said deposition chamber at a deposition temperature for covering said silicon layers with a layer of said metal;
   d) conveying said substrate from said deposition chamber to a non-oxidizing ambience created in an intermediate chamber for preventing said layer of said metal with said high-temperature melting-point from oxidation;
   e) conveying said substrate from said intermediate chamber to an annealing chamber without exposing said layer of said metal with said high-temperature melting-point to an oxidizing atmosphere; and
   f) converting said layer of said metal with said high-temperature melting-point to silicide layers of said metal with said high-temperature melting-point.

3. The process as set forth in claim 2, wherein said non-oxidizing ambience is created by introducing said inert gas.

4. The process as set forth in claim 3, in which insulating layers are formed on said substrate together with said silicon layers, and said silicon layers and said insulating layers are covered with said metal layer with said high-temperature melting-point.

5. The process as set forth in claim 4, in which said step f) includes the sub-steps of
   f-1) treating said layer of said metal with said high-temperature melting-point with heat at a first annealing temperature so as to convert parts of said layer of said metal with said high-temperature melting-point on said silicon layers to a first kind of silicide layer of said metal with said high-temperature melting-point,
   f-2) removing the remaining parts on said insulating layers from said metal layer with said high-temperature melting-point, and
   f-3) treating the layers of said first kind of silicide of said metal with said high-temperature melting-point with heat at a second annealing temperature so as to convert said layers of said first kind of silicide of said metal with said high-temperature melting-point to layers of a second kind of silicide of said metal with said high-temperature melting-point different in composition from said first kind of silicide of said metal with said high-temperature melting-point.

6. The process as set forth in claim 5, in which said metal with said high-temperature melting-point, said first kind of silicide of said metal with said high-temperature melting-point and said second kind of silicide of said metal with said high-temperature melting-point are cobalt, cobalt monosilicide and cobalt disilicide, respectively.

7. The process as set forth in claim 3, in which said remaining parts are etched away by using an etching solution containing hydrochloride acid and hydrogen peroxide.

8. The process as set forth in claim 6, in which said layers of said cobalt disilicide are formed on gate electrodes of polysilicon.

9. The process as set forth in claim 6, in which said layers of said cobalt disilicide are formed on impurity regions of single crystalline silicon.

10. The process as set forth in claim 6, in which said layers of said cobalt disilicide are formed on gate electrodes of polysilicon and impurity regions of single crystalline silicon.

11. The process as set forth in claim 3, in which said inert gas has room temperature so that said metal with said high-temperature melting point is cooled to said room temperature.

12. The process as set forth in claim 11, in which said layer of said metal with said high-temperature melting-point is formed of cobalt, said deposition temperature ranges between 200 degrees and 500 degrees in centigrade, and said annealing temperature is equal to or greater than 500 degrees in centigrade.

13. The process as set forth in claim 12, in which said step f) includes the sub-steps of
   f-1) treating said layer of said metal with said high-temperature melting-point with heat at a first annealing temperature equal to or greater than 500 degrees in centigrade so as to convert parts of said layer of said metal with said high-temperature melting-point on said silicon layers to layers of cobalt monosilicide or cobalt disilicide.
   f-2) removing the remaining parts on said insulating layers from said layer of said metal with said high-temperature melting point, and
   f-3) treating said layers of cobalt monosilicide and cobalt disilicide with heat at a second annealing temperature higher than 500 degrees in centigrade so as to convert said layers of cobalt monosilicide to layers of cobalt disilicide.

14. The process as set forth in claim 3, in which said layer of said metal with said high-temperature melting-point is selected from the group consisting of cobalt, nickel, iron and titanium.

15. The process as set forth in claim 3, in which said steps b), c) and d) are repeated, and said inert gas was periodically replaced with fresh inert gas.

16. The process as set forth in claim 15, in which said inert gas is replaced with said fresh inert gas before every step d).

17. The process of claim 13, wherein said metal comprises at least one of cobalt and dicobalt monosilicide.

18. The process of claim 2, wherein oxygen partial pressure, water concentration and temperature of said non-oxidizing ambience are controlled in accordance with a monitoring device positioned in said intermediate chamber.

19. The process of claim 18, wherein said step (d) is performed after at least one of said oxygen partial pressure and said water concentration is controlled in said intermediate chamber.

20. The process of claim 18, further comprising generating said non-oxidizing ambience with said monitoring device that controls an interval at which air is evacuated and inert gas is pumped into said intermediate chamber.

21. A process for fabricating a semiconductor device, comprising:

- a-1) placing a substrate having silicon layers in a load-lock chamber;
- a-2) developing a first vacuum in the load-lock chamber having a pressure of $1\times10^{-5}$ torr;
- a-3) introducing an inert gas into said load-lock chamber;
- a-4) developing a second vacuum in the load-lock chamber having a pressure of $1\times10^{-6}$ torr by evacuating said inert gas from said load-lock chamber; and
- b) conveying said substrate to a deposition chamber of a sputtering system;
- c) depositing ruthenium over capacitor electrodes of said substrate and depositing a metal with a high-temperature melting-point over a metal gate or a poly-metal gate through a sputtering in said deposition chamber;
- d) conveying said substrate from said deposition chamber to a non-oxidizing ambience created in an intermediate chamber for preventing said layer of said metal with said high-temperature melting-point from oxidation;
- e) conveying said substrate from said intermediate chamber to an annealing chamber without exposing said layer of said metal with said high-temperature melting-point to an oxidizing atmosphere; and
- f) converting said layer of said metal with said high-temperature melting-point to silicide layers of said metal with said high-temperature melting-point.

* * * * *